United States Patent
Holdstock et al.

(10) Patent No.: US 11,784,416 B2
(45) Date of Patent: Oct. 10, 2023

(54) TUNABLE RADIO FREQUENCY (RF) ABSORBER AND THERMAL HEAT SPREADER

(71) Applicant: Raytheon Company, Waltham, MA (US)

(72) Inventors: Jeremy J. Holdstock, McKinney, TX (US); James E. Foreman, Frisco, TX (US); David R. Gorman, Lucas, TX (US); Darrell W. Miller, Allen, TX (US)

(73) Assignee: Raytheon Company, Waltham, MA (US)

( * ) Notice: Subject to any disclaimer, the term of this patent is extended or adjusted under 35 U.S.C. 154(b) by 450 days.

(21) Appl. No.: 16/735,497

(22) Filed: Jan. 6, 2020

(65) Prior Publication Data

US 2021/0210862 A1 Jul. 8, 2021

(51) Int. Cl.
*H01Q 17/00* (2006.01)
*H05K 9/00* (2006.01)

(52) U.S. Cl.
CPC ......... *H01Q 17/008* (2013.01); *H05K 9/0088* (2013.01)

(58) Field of Classification Search
CPC ............ H01Q 1/02; H01Q 1/28; H01Q 1/521; H01Q 15/0013; H01Q 17/00; H01Q 17/008; H05K 9/0088
See application file for complete search history.

(56) References Cited

U.S. PATENT DOCUMENTS

| 5,576,710 A | 11/1996 | Broderick et al. |
| 6,538,596 B1 * | 3/2003 | Gilbert ............... H01Q 15/0026 342/4 |
| 7,608,326 B2 | 10/2009 | Johnson |
| 2003/0112186 A1 | 6/2003 | Sanchez et al. |
| 2010/0156695 A1 | 6/2010 | Sim et al. |
| 2014/0097995 A1 * | 4/2014 | McKinzie, III ........ H01Q 21/26 29/601 |
| 2015/0009084 A1 | 1/2015 | Coupa et al. |

(Continued)

FOREIGN PATENT DOCUMENTS

| EP | 3196976 A1 | 7/2017 | |
| WO | WO-2007069367 A1 * | 6/2007 | ............... H01Q 1/38 |

(Continued)

OTHER PUBLICATIONS

Laird Technologies, "Hybrid Thermal Transfer/EMI Absorber CoolZorb 400 Series," May 2019, 2 pages.

(Continued)

*Primary Examiner* — Timothy A Brainard (57) ABSTRACT

An apparatus includes a first layer having an RF lossy material, a second layer having the RF lossy material, and a plurality of conductive or resistive pads arranged in a planar array between the first layer and the second layer. The apparatus may also include a plurality of thermal vias, where each thermal via may correspond to one of the pads, may extend through at least the first layer, and may be formed of a thermally-conductive material. Dimensions of each pad may be selected based on a desired resonant frequency band, and the desired resonant frequency band may be associated with RF energy transmitted by at least one RF source in proximity to the apparatus.

20 Claims, 5 Drawing Sheets

(56) References Cited

U.S. PATENT DOCUMENTS

| | | | |
|---|---|---|---|
| 2015/0141268 A1* | 5/2015 | Rothberg | B01L 3/5085 |
| | | | 438/22 |
| 2015/0171498 A1 | 6/2015 | McKinzie, III | |
| 2016/0233173 A1 | 8/2016 | Do et al. | |
| 2017/0317424 A1 | 11/2017 | Sim et al. | |
| 2017/0325327 A1* | 11/2017 | Smith | H05K 1/021 |
| 2017/0346179 A1* | 11/2017 | Wu | H04B 7/0413 |
| 2018/0191052 A1 | 7/2018 | Ndip et al. | |
| 2018/0337447 A1 | 11/2018 | Shinojima | |
| 2019/0215948 A1 | 7/2019 | Amitz et al. | |

FOREIGN PATENT DOCUMENTS

| | | | | |
|---|---|---|---|---|
| WO | 2007/080368 A1 | 7/2007 | | |
| WO | WO-2007080368 A1 * | 7/2007 | ......... | H01Q 15/0013 |
| WO | 2013/182104 A1 | 12/2013 | | |
| WO | 2016/209181 A1 | 12/2016 | | |

OTHER PUBLICATIONS

Mast Technologies, "Suppress-n-Sink™ Dual Use RF Absorber + Thermal Pad," Nov. 2013, 1 page.
Sandora, "Isolation Improvement with Electromagnetic Band Gap Surfaces," Lincoln Laboratory Journal, vol. 19, No. 1, 2012, pp. 51-61.
International Search Report dated Dec. 1, 2020 in connection with International Patent Application No. PCT/US2020/053255, 4 pages.
Written Opinion of the International Searching Authority dated Dec. 1, 2020 in connection with International Patent Application No. PCT/US2020/053255, 6 pages.

* cited by examiner

TUNABLE RADIO FREQUENCY (RF) ABSORBER AND THERMAL HEAT SPREADER

TECHNICAL FIELD

This disclosure is directed in general to reducing the transfer of radio frequency (RF) energy and/or increasing the transfer of thermal energy between components. More specifically, this disclosure relates to a tunable RF absorber and thermal heat spreader.

BACKGROUND

When multiple antennas are operating in the same frequency band on the same platform, it can be important to minimize the amount of energy that gets coupled from one antenna to one or more other antennas. One approach for minimizing this energy transfer is to use radio frequency (RF) absorbing materials between the antennas. Typical RF absorbing materials function relative to their electrical thickness. That is, lower frequencies require thicker materials, which increases volume and weight allocations and increases thermal isolation. This, in turn, reduces the ability to remove thermal energy from internal heat sources, making it more difficult to cool those heat sources.

SUMMARY

This disclosure provides a tunable radio frequency (RF) absorber and thermal heat spreader.

In a first embodiment, an apparatus includes a first layer having an RF lossy material, a second layer having the RF lossy material, and a plurality of conductive or resistive pads arranged in a planar array between the first layer and the second layer.

In a second embodiment, a system includes a first RF source, a second RF source, and an RF absorber disposed between the first RF source and the second RF source. The RF absorber is configured to absorb RF energy transmitted between the first RF source and the second RF source. The RF absorber includes a first layer having an RF lossy material, a second layer having the RF lossy material, and a plurality of conductive or resistive pads arranged in a planar array between the first layer and the second layer.

In a third embodiment, a method includes providing a first layer having an RF lossy material. The method also includes positioning a plurality of conductive or resistive pads over a surface of the first layer. The method further includes positioning a second layer over the plurality of conductive or resistive pads, where the second layer has the RF lossy material.

Other technical features may be readily apparent to one skilled in the art from the following figures, descriptions, and claims.

BRIEF DESCRIPTION OF THE DRAWINGS

For a more complete understanding of this disclosure, reference is now made to the following description, taken in conjunction with the accompanying drawings, in which.

DETAILED DESCRIPTION

FIGS. 1 through 6, described below, and the various embodiments used to describe the principles of the present disclosure in this patent document are by way of illustration only and should not be construed in any way to limit the scope of the disclosure. Those skilled in the art will understand that the principles of the present disclosure may be implemented in any type of suitably arranged device or system.

For simplicity and clarity, some features and components are not explicitly shown in every figure, including those illustrated in connection with other figures. It will be understood that all features illustrated in the figures may be employed in any of the embodiments described. Omission of a feature or component from a particular figure is for purposes of simplicity and clarity and is not meant to imply that the feature or component cannot be employed in the embodiments described in connection with that figure.

As discussed above, when multiple antennas are operating in the same frequency band in proximity to each other, it can be important to minimize the amount of energy that gets coupled from one antenna to one or more other antennas. This may be particularly important when one or more antennas are acting in transmit mode and one or more other antennas are acting in receive mode.

Various approaches have been used to try and improve the isolation between antennas. For example, some approaches increase the antennas' physical separation distance, provide a polarization difference between antennas, or point the antennas away from each other. Other approaches use a barrier wall formed from one or more RF absorbing materials between antennas. However, in many applications, these approaches are limited in usage or effectiveness due to various reasons, such as platform size constraints, field of view requirements, polarization requirements, and mechanical or aeronautical impacts. For instance, typical bulk RF absorbing materials, including magnetic radar absorbing materials (MagRAMs), have frequency responses proportional to their thicknesses. As a result, lower frequencies require thicker materials, which increases volume and weight allocations and increases the thermal resistance through the material. This, in turn, reduces the ability to remove thermal energy from internal heat sources, making it more difficult to cool those heat sources.

Embodiments of this disclosure provide various RF absorber structures that are tunable over frequency and incident angle. In some embodiments, an RF absorber structure includes multiple conductive and/or resistive pads arranged in a grid, array, or other pattern. By selecting the size of the pads and the distance between them, the frequency response of the absorber structure can be tuned over a resonant frequency band and incident angle. As a result, the RF absorber structure can exhibit improved RF absorption at lower frequencies while maintaining a relatively thin profile. Moreover, in some embodiments, an RF absorber structure includes a thermal energy spreader that provides improved thermal conductivity. For instance, the pads may also act as heat spreaders to help distribute thermal energy across a larger surface area. In some cases, the thermal energy spreader includes multiple thermal vias that provide an efficient thermal path through the RF absorber structure.

It will be understood that embodiments of this disclosure may include any one, more than one, or all of the features described here. Also, embodiments of this disclosure may additionally or alternatively include other features not listed here. While the disclosed embodiments may be described with respect to aerospace or defense-related applications, these embodiments are also applicable in any other suitable systems or applications.

Figure 1:
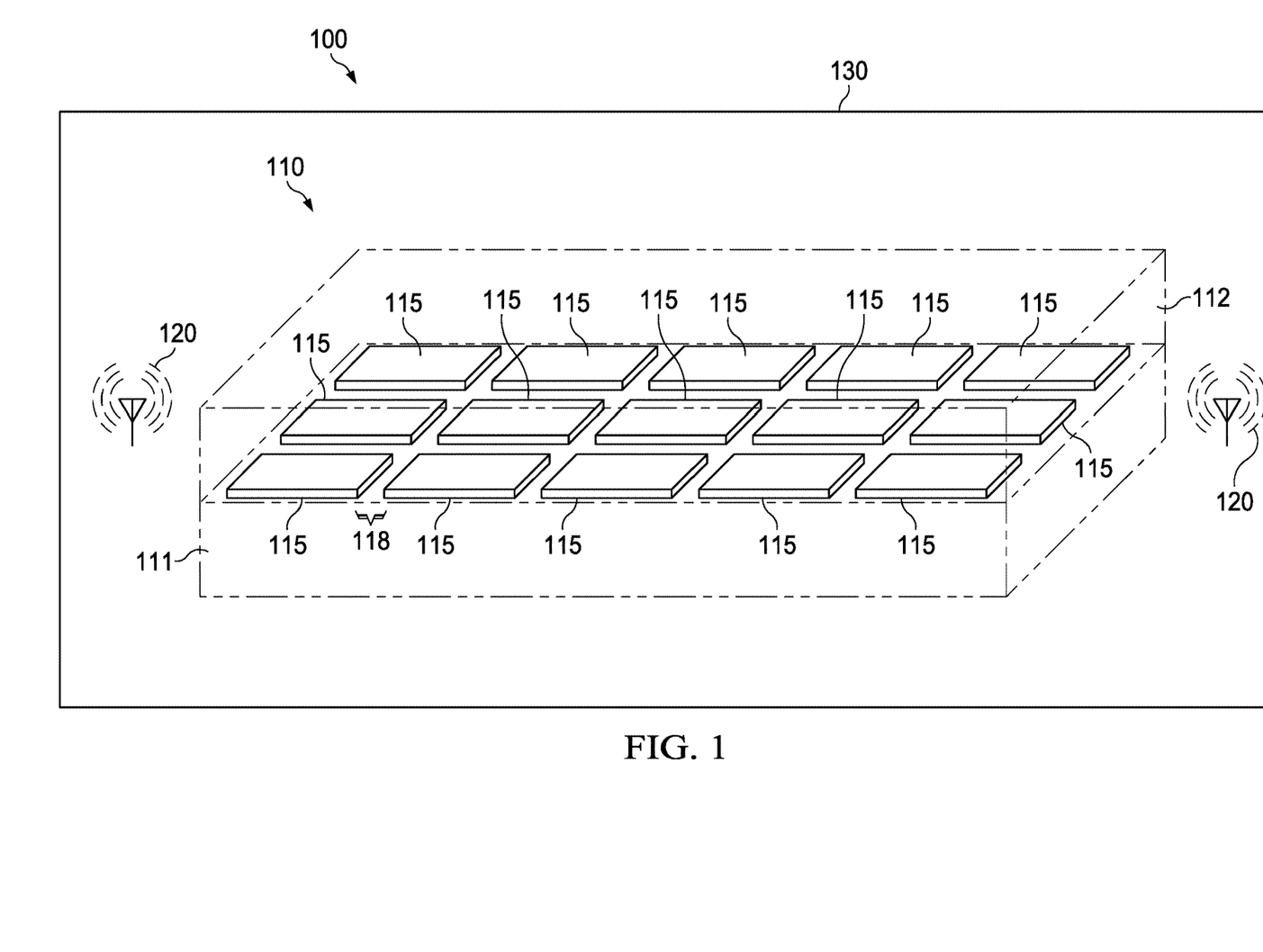
FIG. 1 illustrates an example system that includes a tunable radio frequency (RF) absorber according to this disclosure.

FIG. 1 illustrates an example system 100 that includes a tunable RF absorber according to this disclosure. As shown in FIG. 1, the system 100 includes an RF absorber structure 110 and multiple RF sources 120 separated by a distance and having the RF absorber structure 110 located between the RF sources 120. Each RF source 120 generally represents a source of RF energy, such as an antenna or any other suitable source of RF energy. In some embodiments, the RF absorber structure 110 and the multiple RF sources 120 are all mounted on a substantially flat or planar surface, such as a wing of an aircraft or a roof of a vehicle. As discussed above, when multiple RF sources 120 are operating in the same frequency band, it can be important to minimize the amount of energy that gets coupled from one RF source 120 to another RF source 120. The RF absorber structure 110 is positioned between the RF sources 120 to absorb RF energy and thereby reduce or minimize the RF energy transmitted between the RF sources 120.

The RF absorber structure 110 includes one or more layers of RF lossy material, which in this example include a first layer 111 and a second layer 112. The RF lossy material is capable of absorbing at least some of the RF energy emitted from the RF sources 120 and received by the RF absorber structure 110. The RF lossy material includes any suitable material or materials that can absorb RF energy. For example, in some embodiments, the RF lossy material in one or more of the layers 111-112 is a Magnetic Radar Absorbing Material (MagRAM). In other embodiments, the RF lossy material in one or more of the layers 111-112 is formed using a compound of components (e.g., fluid urethane, silicone, carbon, thermosets, thermoplastics, elastomers, and the like) that increase the absorptive properties of the material. In some cases, this type of mixture can be poured into a mold and allowed to cure into solid sheets, and the sheets can be machined or cut into the layers 111-112. Of course, any other suitable RF lossy material(s) may be used in the layers 111-112, and the layers 111-112 may be formed in any other suitable manner. In addition, the layers 111-112 may have any suitable size, shape, and dimensions. In some embodiments, each layer 111-112 is approximately 45 mils (0.045 inches or 1.143 millimeters) thick, although this is merely an example. Also, the layers 111-112 can have the same thickness or different thicknesses.

Disposed between the layers 111-112 is an array of conductive or resistive pads 115 that are arranged in a grid pattern having multiple columns and rows. A gap 118 exists between adjacent pads 115. The pads 115 collectively act as an "impedance sheet" that alters the RF response of the absorber 110. This helps to extend the RF absorbing capabilities of the layers 111-112 below their normal operating frequencies. In some embodiments, the pads 115 act as a frequency selective surface (FSS).

By selecting the size, thickness, and gap size of the pads 115, the frequency response of the RF absorber structure 110 can be tuned to a specific resonant frequency band. Each pad 115 may therefore have any suitable size, shape, and dimensions based on the intended application. In some embodiments, each pad 115 is a square that is approximately 50 mils (0.05 inches or 1.27 millimeters) across, and the gap 118 between the adjacent pads 115 is approximately 5 mils (0.005 inches or 0.127 millimeters). Of course, other sizes, thicknesses, and gap sizes are possible, including some that are discussed in greater detail below. Also, other shapes for the pads 115 are possible, such as circular, triangular, polygonal, or rectangular. In addition, other arrangements for the pads 115 are possible, including radial patterns or offset/staggered grid arrangements. In addition, multiple layers of pads 115 may be located in the RF absorber structure 110.

The pads 115 may be formed from any suitable electrically-conductive or resistive material(s). For example, the pads 115 may be formed using copper, silver, nichrome, brass, other conductive metal(s), Permalloy, Mu-metal, or the like. In some embodiments, the pads 115 are formed together from a single sheet that is then processed, such as by machining or laser-etching, to produce the gaps 118. In other embodiments, the pads 115 are individually formed and arranged, such as by using a template or patterning tool. In other embodiments, the pads 115 are etched on a thin substrate, such as a circuit board. Also, in some embodiments, the pads 115 may be bonded to one or both layers 111-112, such as by using an adhesive. This may be accomplished, for example, by spraying a thin layer of fluid urethane material or other adhesive on the layer 111, placing the pads 115 on the layer 111, and allowing the thin layer to cure, thereby bonding the pads 115 to the layer 111. Later, the layer 112 can be placed over the pads 115 and the layer 111 and bonded to the layer 111, such as by using another thin layer of fluid urethane material or other adhesive.

In some embodiments, the RF absorber structure 110 and the RF sources 120 may be enclosed in a defined volume, such as an enclosed space 130. The enclosed space 130 may be such that there is limited physical separation between the RF sources 120 that can be achieved to reduce RF interference. Similarly, in some embodiments, the enclosed space 130 may have weight or aerodynamic requirements that can determine, at least in part, the overall weight and dimensions of the RF absorber structure 110. For example, the enclosed space 130 may represent part of a flight or space vehicle, such as an airplane, missile, rocket, or satellite. However, these are merely examples, and other systems and structures (such as ground-based structures) are within the scope of this disclosure.

Although FIG. 1 illustrates one example of a system 100 that includes a tunable RF absorber, various changes may be made to FIG. 1. For example, while two RF sources 120 are shown in FIG. 1, only one RF source 120 may be present, and the RF absorber structure 110 may be used to "directionalize" the transmission of RF energy from the single RF source 120 by absorbing the RF energy in unwanted directions. Among other things, this can help to isolate electronic components that are sensitive to RF energy. In still other embodiments, more than two RF sources 120 may be present in the system 100, and multiple instances of the RF absorber structure 110 may be used. In addition, while FIG. 1 shows two layers 111-112 and one layer of pads 115, other embodiments may include more than two layers of RF lossy material and/or more than one layer of pads 115. In general, the makeup and arrangement of the system 100 are for illustration only, and components can be added, omitted, replicated, combined, further subdivided, or placed in any other configuration according to particular needs.

Figure 2:
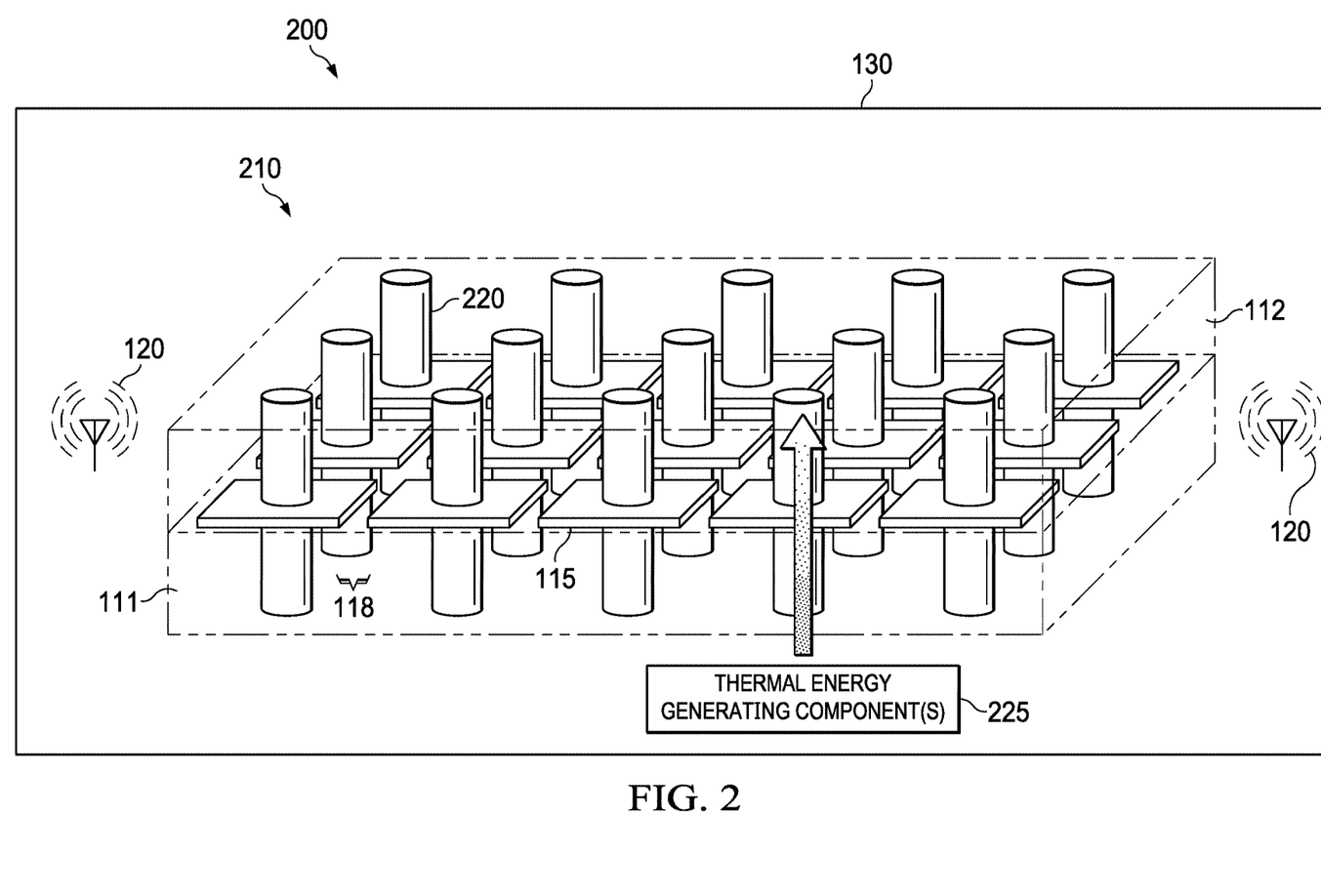
FIG. 2 illustrates an example system that includes a tunable RF absorber and thermal energy spreader according to this disclosure.

FIG. 2 illustrates an example system 200 that includes a tunable RF absorber and thermal energy spreader according to this disclosure. As shown in FIG. 2, the system 200 includes an RF absorber structure 210 and the RF sources 120, which are separated by a distance and have the RF absorber structure 210 located between the RF sources 120. In some embodiments, the RF absorber structure 210 and the RF sources 120 may be enclosed in a defined volume, such as the enclosed space 130.

The system 200 also includes one or more thermal energy generating components 225, such as one or more high-power electronic components. The thermal energy generating components 225 are in proximity to the RF absorber structure 210 and generate and release thermal energy, usually as waste heat. Because some thermal energy generating components 225 are sensitive to overheating or thermal excursions, it may be necessary or desirable to transmit at least some of the generated thermal energy away from the thermal energy generating components 225. As discussed below, the RF absorber structure 210 is capable of transmitting at least some of the generated thermal energy away from the thermal energy generating components 225, as well as minimizing transmission of RF energy between the RF sources 120.

Similar to the RF absorber structure 110 of FIG. 1, the RF absorber structure 210 includes the array of pads 115 disposed between the multiple layers 111-112 of RF lossy material. In addition, the RF absorber structure 210 includes a plurality of thermal vias 220. Each thermal via 220 corresponds to one of the pads 115, and each pad 115 may be associated with one thermal via 220 or more than on thermal via 220.

As shown in FIG. 2, each thermal via 220 extends through the RF absorber structure 210, including through the layers 111-112 and through the associated pad 115. Ends of each thermal via 220 are exposed on the outer surfaces of the RF absorber structure 210. The thermal vias 220 therefore allow thermal energy to be conducted through the RF absorber structure 210 while still providing the tunable, RF absorbing benefits described above (such as being tunable to a specific frequency band). For example, thermal energy can be transferred from the thermal energy generating components 225, through the thermal vias 220, to the other side of the layer 112 as indicated by the arrow in FIG. 2.

The thermal vias 220 can be formed of any suitable thermally-conductive material(s). In some embodiments, the thermal vias 220 may include aluminum, copper, boron nitride, thermal pyrolytic graphite (TPG), a thermal paste, another thermally-conductive material, or a combination of two or more of these. The thermal vias 220 can also be formed in any suitable manner. In some embodiments, the thermal vias 220 can be formed by creating holes through the pads 115 and the layers 111-112 and then filling the holes with the thermally-conductive material(s). The holes can be formed by machining (such as mechanical drilling or stamping), water etching, laser etching, or other suitable technique. In FIG. 2, the thermal vias 220 are shown as being circular in cross-section since a circular opening is generally easy to fabricate. However, this is merely one example, and the thermal vias 220 can be formed in other suitable shapes and sizes.

As a result of the thermal vias 220, an efficient thermal path is introduced into the RF absorber structure 210, making the structure more thermally conductive. This helps to keep the one or more thermal energy generating components 225 cooler and avoid overheating or temperature excursions, particularly when these components are disposed in an enclosed space (such as the enclosed space 130).

Although FIG. 2 illustrates one example of a system 200 that includes a tunable RF absorber and thermal energy spreader, various changes may be made to FIG. 2. For example, while two RF sources 120 are shown in FIG. 2, only one RF source 120 may be present, and the RF absorber structure 210 may be used to directionalize the transmission of RF energy from the single RF source 120. In still other embodiments, more than two RF sources 120 may be present in the system 200, and multiple instances of the RF absorber structure 210 may be used. Also, while FIG. 2 shows two layers 111-112 and one layer of pads 115, other embodiments may include more than two layers of RF lossy material and/or more than one layer of pads 115. Further, while the RF absorber structure 210 is shown with substantially planar layers 111-112, the RF absorber structure 210 can have any suitable shape, such as one that encloses or substantially encloses the thermal energy generating components 225 or one or more of the RF sources 120. In addition, while FIG. 2 shows a thermal via 220 through the center of every pad 115, other arrangements are possible. For instance, only some pads 115 (such as every other one) may include thermal vias 220, the thermal vias 220 may pass through the pads 115 off center, or the thermal vias 220 may pass through the gaps 118 between the pads 115. In general, the makeup and arrangement of the system 200 are for illustration only, and components can be added, omitted, replicated, combined, further subdivided, or placed in any other configuration according to particular needs.

FIGS. 3A through 3F illustrate other examples of tunable RF absorber structures 301-306 in different configurations according to this disclosure. In FIGS. 3A through 3F, only one pad 115 of each RF absorber structure 301-306 is shown for simplicity and clarity. It will be understood that the RF absorber structures 301-306 can include multiple pads 115 arranged in an array or other pattern, such as shown in FIGS. 1 and 2.

Figure 3A:
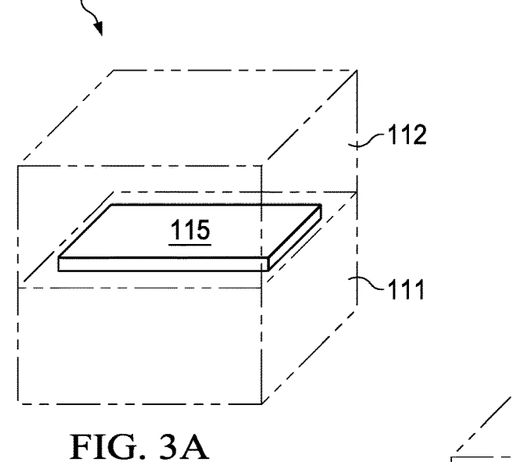
FIGS. 3A through 3F illustrate other examples of tunable RF absorber structures in different configurations according to this disclosure.
Figure 3B:
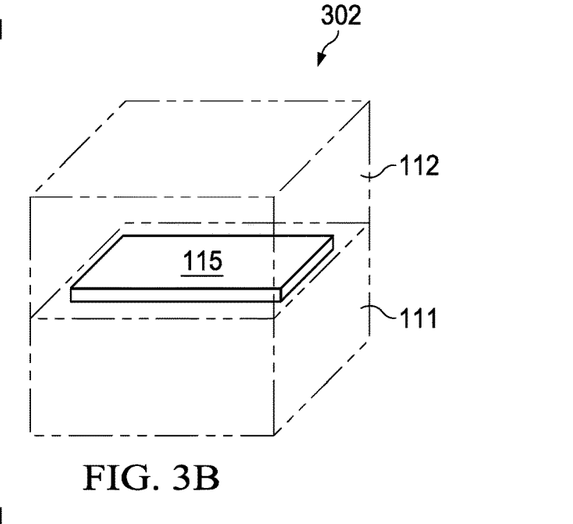
Figure 3C:
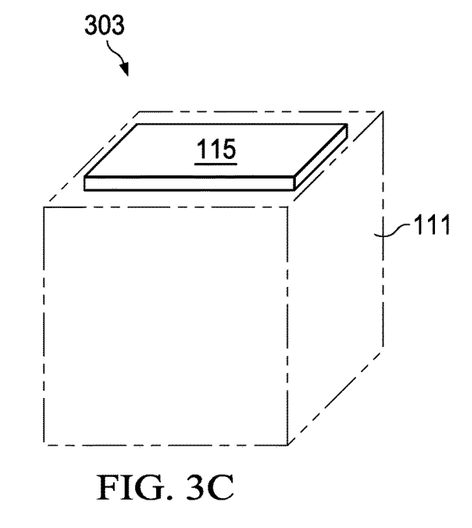

In FIG. 3A, the RF absorber structure 301 is similar to the RF absorber structure 110 of FIG. 1, with pads 115 disposed between two layers 111-112 of RF lossy material. In FIG. 3B, the RF absorber structure 302 is similar to the RF absorber structure 301 of FIG. 3A, but the gap between adjacent pads 115 in the RF absorber structure 302 is larger than the gap between adjacent pads 115 in the RF absorber structure 301. In FIG. 3C, the RF absorber structure 303 includes only one layer 111, and the pads 115 are disposed on an exterior surface of the layer 111.

Figure 3D:
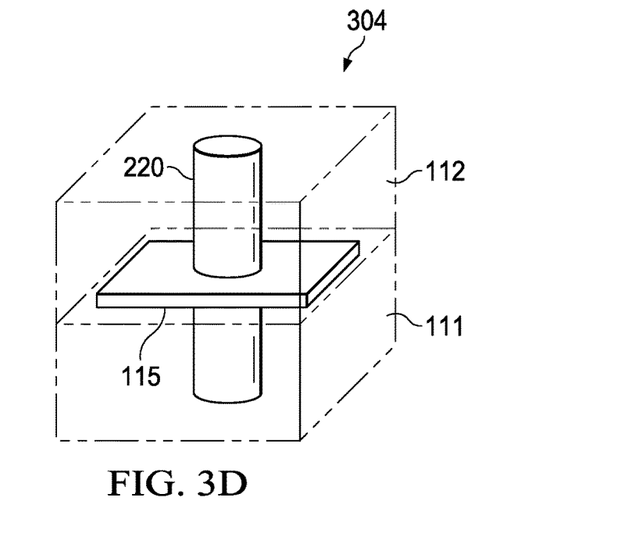
Figure 3E:
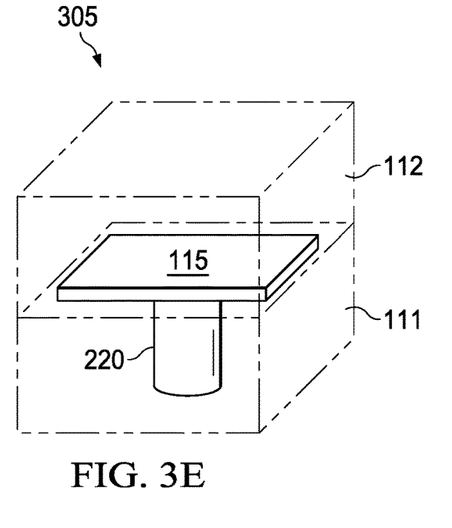
Figure 3F:
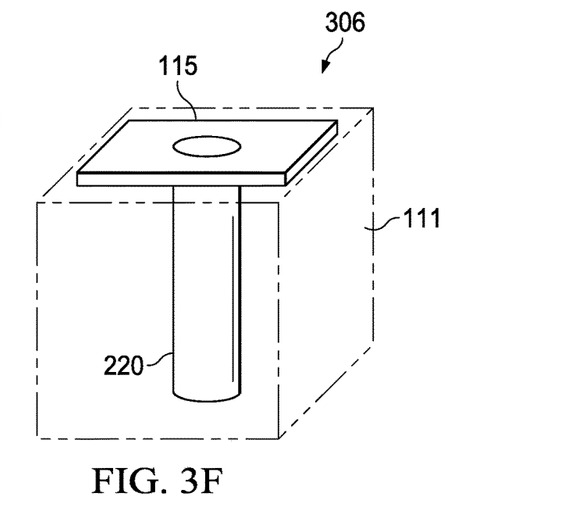

In FIGS. 3D through 3F, the RF absorber structures 304-306 include the thermal vias 220 in different configurations. In FIG. 3D, the RF absorber structure 304 is similar to the RF absorber structure 210 of FIG. 2, with pads 115 disposed between two layers 111-112 of RF lossy material and thermal vias 220 that pass through the layers 111-112 and the pads 115. In FIG. 3E, the RF absorber structure 305 includes thermal vias 220 that extend only through the layer 111, terminating where the pad 115 meets the layer 111. In FIG. 3F, the RF absorber structure 306 includes only one layer 111, the pads 115 are disposed on an exterior surface of the layer 111, and the thermal vias 220 extend through the layer 111 and the pads 115.

Table 1 provides example dimensions for each of the RF absorber structures 301-306. Of course, these dimensions are merely examples, and other dimensions are within the scope of this disclosure. Based on the dimensions provided in Table 1, it will be apparent that the components of the RF absorber structures 301-306 are not all drawn to scale in FIGS. 3A through 3F.

TABLE 1

RF Absorber Structure Configurations

| Structure Ref. No. | 301 | 302 | 303 | 304 | 305 | 306 |
|---|---|---|---|---|---|---|
| Pad size | 50 mil | 50 mil | 50 mil | 50 mil | 50 mil | 50 mil |
| Pad height | 22.5 mil | 22.5 mil | 45 mil | 22.5 mil | 22.5 mil | 45 mil |
| Gap between pads | 5 mil | 14 mil | 26 mil | 9 mil | 9 mil | 14 mil |
| Layer thickness | 45 mil | 45 mil | 45 mil | 45 mil | 45 mil | 45 mil |
| Thermal via diam. | N/A | N/A | N/A | 25 mil | 25 mil | 25 mil |
| Thermal via height | N/A | N/A | N/A | 45 mil | 22.5 mil | 45 mil |

Although FIGS. 3A through 3F illustrate specific configurations of tunable RF absorber structures 301-306, various changes may be made to FIGS. 3A through 3F. For example, the RF absorber structures 301-306 and their individual components can have any other suitable sizes, shapes, and dimensions. As a particular example, the RF absorber structures 301-306 may have a shape that encloses or substantially encloses one or more thermal energy generating components or one or more of RF sources.

Figure 4:
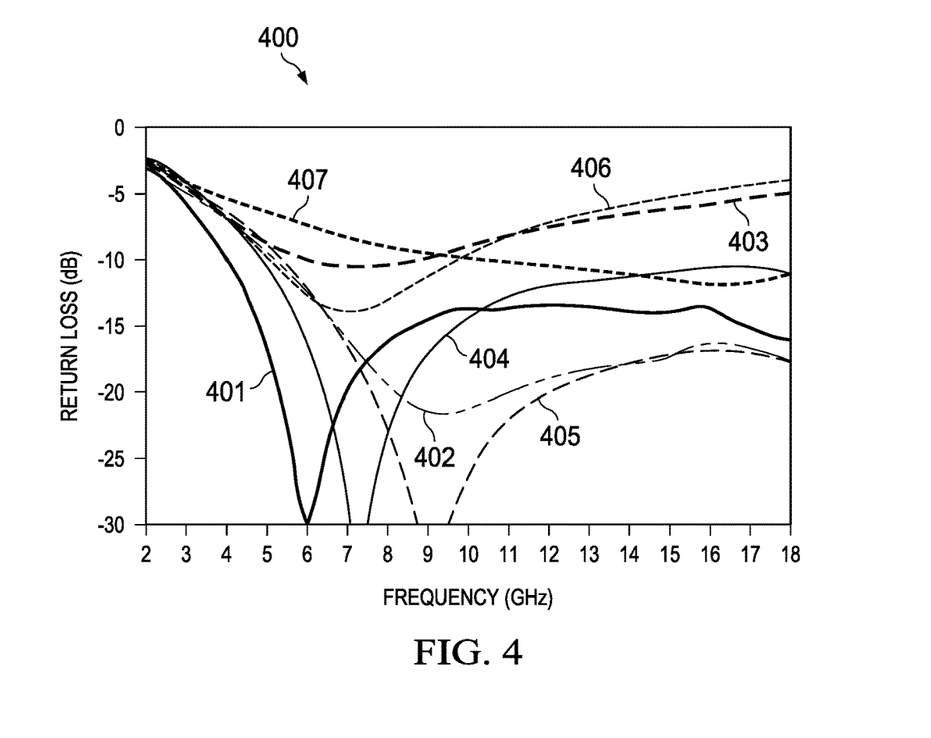
FIG. 4 illustrates an example chart showing frequency responses for RF absorber structures in different configurations according to this disclosure.

FIG. 4 illustrates an example chart 400 showing frequency responses for RF absorber structures in different configurations according to this disclosure. As shown in FIG. 4, the chart 400 includes RF operating frequency (GHz) on the x-axis and return loss (in dB) on the y-axis. The return loss corresponds to the amount of RF energy that is absorbed by the RF absorber structure. The larger the return loss in dB, the more RF energy is being absorbed.

Plots 401-407 in FIG. 4 illustrate return losses for different RF absorber structures. In particular, the return losses are based on perpendicular polarization at a 70° incident angle. The plots 401-406 correspond to the RF absorber structures 301-306 of FIGS. 3A through 3F. For comparison, the plot 407 corresponds to a single layer 111 of RF lossy material without any conductive or resistive pads or thermal vias. As indicated in FIG. 4, different RF absorber structures provide greater absorption at different frequencies. Thus, depending on the desired operating frequency, the RF absorber structure can be selected or tailored for optimal absorption for that frequency.

Although FIG. 4 illustrates one example of a chart 400 showing frequency responses for RF absorber structures in different configurations, various changes may be made to FIG. 4. For example, the frequency responses here relate to specific implementations of the RF absorber structures, and different implementations of the RF absorber structures can have different frequency responses.

Figure 5:
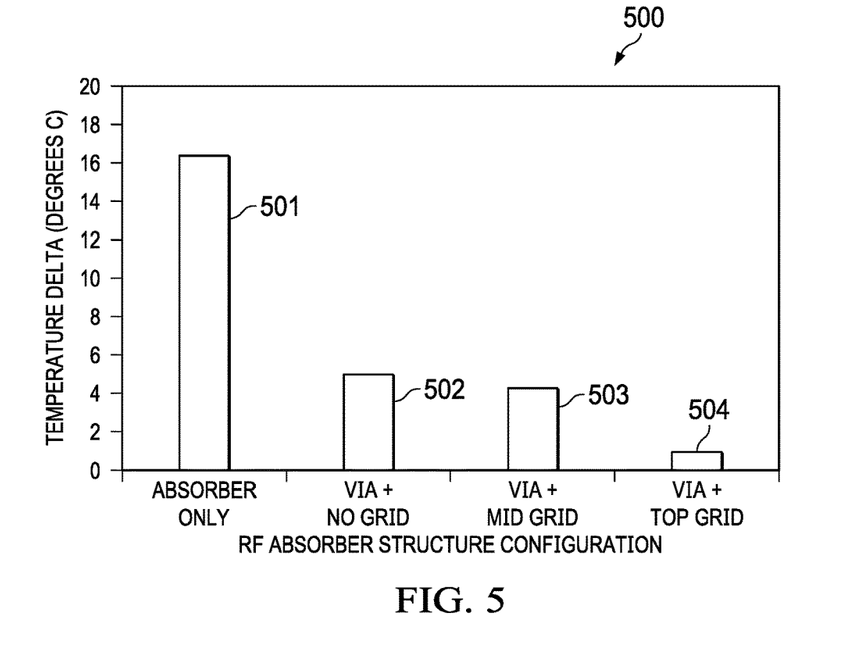
FIG. 5 illustrates an example bar chart showing thermal conductivity properties for RF absorber structures in different configurations according to this disclosure.

FIG. 5 illustrates an example bar chart 500 showing thermal conductivity properties for RF absorber structures in different configurations according to this disclosure. As shown in FIG. 5, the bar chart 500 identifies RF absorber structures in different configurations on the x-axis and temperature differences (° C.) on the y-axis. The temperature differences indicate differences in temperature between a first exterior surface of an RF absorber structure and a second exterior surface opposite the first surface, where the first surface is proximate to a thermal energy generating component. For the purposes of FIG. 5, assume the first and second surfaces are approximately 45 square inches (29,032.2 square millimeters) in area, and assume the thermal energy generating component is a 250 watt power supply. The smaller the temperature delta, the more thermal energy that is transmitted through the RF absorber structure.

Bars 501-504 in FIG. 5 illustrate temperature differences for different configurations of RF absorber structures. More specifically, the bar 501 corresponds to a structure that includes one or more layers of RF lossy material only without any pads or thermal vias. The bar 502 corresponds to a structure that includes thermal vias but no pads. The bar 503 corresponds to a structure that includes pads between two layers of RF lossy material and thermal vias. The bar 504 corresponds to a structure that includes pads on a top surface of a layer of RF lossy material and thermal vias through the pads and the layer of RF lossy material. The results shown in FIG. 5 illustrate that substantial thermal improvements can be obtained from the use of thermal vias in the RF absorber structure.

Although FIG. 5 illustrates one example of a bar chart 500 showing thermal conductivity properties for RF absorber structures in different configurations, various changes may be made to FIG. 5. For example, the thermal conductivity properties here relate to specific implementations of the RF absorber structures, and different implementations of the RF absorber structures can have different thermal conductivity properties.

Figure 6:
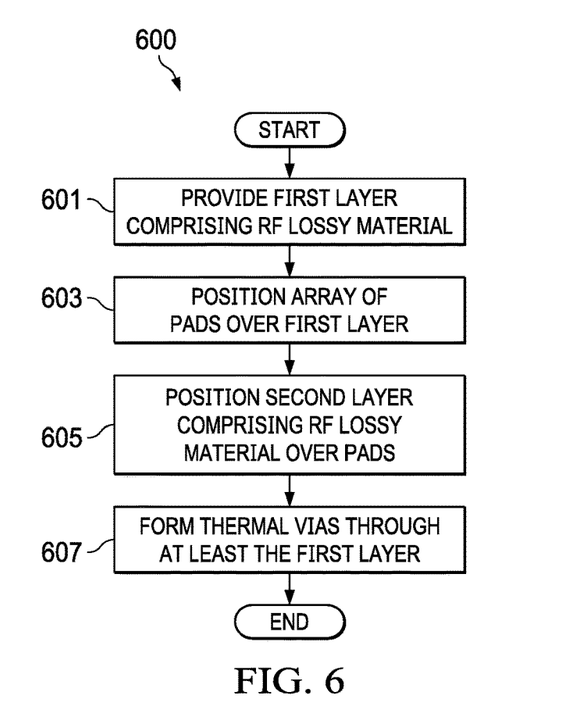
FIG. 6 illustrates an example method for producing a tunable RF absorber according to this disclosure.

FIG. 6 illustrates an example method 600 for producing a tunable RF absorber according to this disclosure. For ease of explanation, the method 600 is described as being performed to produce the RF absorber structure 210 of FIG. 2. However, the method 600 can be used with any other suitable RF absorber structure, including any other RF absorber structures described above.

At step 601, a first layer that includes an RF lossy material is provided. This may include, for example, forming or otherwise obtaining the first layer 111 of the RF lossy material as shown in FIGS. 1 and 2. The RF lossy material may be formed of MagRAM, a urethane mixture, a silicone mixture, a thermoset, a thermoplastic, an elastomer, any other suitable material(s), or a combination of two or more of these.

At step 603, conductive or resistive pads are positioned over a surface of the first layer. This may include, for example, forming or placing the pads 115 of FIGS. 1 and 2 over the top surface of the layer 111. The pads may be formed of copper or other conductive or resistive material(s). In some embodiments, the pads 115 can be bonded to the layer 111, such as by spraying a thin layer of the RF lossy material on the layer 111, placing the pads 115 on the layer 111, and allowing the thin layer to cure and thereby form a dry bond between the pads 115 and the layer 111.

At step 605, a second layer is positioned over the pads, where the second layer includes the RF lossy material. This may include, for example, forming or positioning the second layer 112 of the RF lossy material over the pads 115, as shown in FIGS. 1 and 2.

At step 607, thermal vias are formed through at least the first layer. Each thermal via corresponds to one of the pads, and each thermal via is formed of at least one thermally-conductive material. This may include, for example, forming the thermal vias 220 through at least the first layer 111. The thermal vias 220 may be formed using one of the techniques described above. The thermal vias 220 may be formed through both layers 111-112 and the pads 115, or the thermal vias 220 may be formed through just the first layer 111.

Although FIG. 6 illustrates one example of a method 600 for producing a tunable RF absorber, various changes may be made to FIG. 6. For example, while shown as a series of steps, various steps shown in FIG. 6 can overlap, occur in parallel, occur in a different order, or occur multiple times. Also, some steps can be combined or removed and additional steps can be added according to particular needs. As a particular example, while FIG. 6 describes the use of first and second layers, in some embodiments (such as shown in FIGS. 3C and 3F), there may be only one layer, in which case step 605 would not be needed.

It may be advantageous to set forth definitions of certain words and phrases used throughout this patent document. The terms "include" and "comprise," as well as derivatives thereof, mean inclusion without limitation. The term "or" is inclusive, meaning and/or. The phrase "associated with," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, have a relationship to or with, or the like. The phrase "at least one of," when used with a list of items, means that different combinations of one or more of the listed items may be used, and only one item in the list may be needed. For example, "at least one of: A, B, and C" includes any of the following combinations: A, B, C, A and B, A and C, B and C, and A and B and C.

The description in the present application should not be read as implying that any particular element, step, or function is an essential or critical element that must be included in the claim scope. The scope of patented subject matter is defined only by the allowed claims. Moreover, none of the claims is intended to invoke 35 U.S.C. § 112(f) with respect to any of the appended claims or claim elements unless the exact words "means for" or "step for" are explicitly used in the particular claim, followed by a participle phrase identifying a function. Use of terms such as (but not limited to) "mechanism," "module," "device," "unit," "component," "element," "member," "apparatus," "machine," or "system" within a claim is understood and intended to refer to structures known to those skilled in the relevant art, as further modified or enhanced by the features of the claims themselves, and is not intended to invoke 35 U.S.C. § 112(f).

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An apparatus comprising:
    a first layer comprising a radio frequency (RF) lossy material mounted to a platform;
    a second layer comprising the RF lossy material;
    a plurality of conductive or resistive pads arranged in a planar array between the first layer and the second layer, the pads separated from each other by gaps, wherein dimensions of each pad and each gap are selected based on a desired resonant frequency band of RF energy transmitted by at least one RF source associated with the platform; and
    a plurality of thermal vias, each thermal via corresponding to one of the pads and extending through at least the first layer, each thermal via formed of a thermally-conductive material;
    wherein each thermal via has a first dimension across the thermal via that is at least one-third as large as a second dimension across the corresponding pad, the first dimension and the second dimension being measured in a same plane.

2. The apparatus of claim 1, wherein each thermal via extends through the first layer, through a center portion of the corresponding pad, and through the second layer.

3. The apparatus of claim 1, wherein each thermal via extends through the first layer and terminates at a first surface of the corresponding pad.

4. The apparatus of claim 1, wherein each pad comprises copper.

5. The apparatus of claim 1, wherein the RF lossy material of the first and second layers comprises urethane or silicone.

6. The apparatus of claim 1, wherein each pad comprises copper.

7. The apparatus of claim 1, wherein the RF lossy material comprises urethane or silicone.

8. The apparatus of claim 1, wherein the platform comprises a land or air vehicle.

9. A system comprising:
    a first radio frequency (RF) source associated with a platform;
    a second RF source associated with the platform; and
    an RF absorber disposed between the first RF source and the second RF source and configured to absorb RF energy transmitted between the first RF source and the second RF source, the RF absorber comprising:
        a first layer comprising an RF lossy material mounted to the platform;
        a second layer comprising the RF lossy material;
        a plurality of conductive or resistive pads arranged in a planar array between the first layer and the second layer, the pads separated from each other by gaps, wherein dimensions of each pad and each gap are selected based on a desired resonant frequency band of the RF energy transmitted between the first RF source and the second RF source; and
        a plurality of thermal vias, each thermal via corresponding to one of the pads and extending through at least the first layer, each thermal via formed of a thermally-conductive material;
        wherein each thermal via has a first dimension across the thermal via that is at least one-third as large as a second dimension across the corresponding pad, the first dimension and the second dimension being measured in a same plane.

10. The system of claim 9, wherein each thermal via extends through the first layer, through a center portion of the corresponding pad, and through the second layer.

11. The system of claim 9, wherein each thermal via extends through the first layer and terminates at a first surface of the corresponding pad.

12. The system of claim 9, wherein each pad comprises copper.

13. The system of claim 9, wherein the RF lossy material of the first and second layers comprises urethane or silicone.

14. The system of claim 9, wherein the first RF source, the second RF source, and the RF absorber are disposed in an enclosed space.

15. The system of claim 9, wherein the platform comprises a land or air vehicle.

16. A method comprising:
providing a first layer comprising a radio frequency (RF) lossy material;
positioning a plurality of conductive or resistive pads over a surface of the first layer such that the pads are separated from each other by gaps, wherein dimensions of each pad and each gap are selected based on a desired resonant frequency band of RF energy transmitted by at least one RF source associated with a platform to which the first layer is to be mounted;
positioning a second layer over the plurality of conductive or resistive pads, the second layer comprising the RF lossy material; and
forming a plurality of thermal vias through at least the first layer, each thermal via corresponding to one of the pads, each thermal via formed of a thermally-conductive material;
wherein each thermal via has a first dimension across the thermal via that is at least one-third as large as a second dimension across the corresponding pad, the first dimension and the second dimension being measured in a same plane.

17. The method of claim 16, wherein each thermal via extends through the first layer, through a center portion of the corresponding pad, and through the second layer.

18. The method of claim 16, wherein each thermal via extends through the first layer and terminates at a first surface of the corresponding pad.

19. An apparatus comprising:
a layer comprising a radio frequency (RF) lossy material mounted to a platform;
a plurality of conductive or resistive pads arranged in a planar array and disposed on an exterior surface of the layer, the pads separated from each other by gaps, wherein dimensions of each pad and each gap are selected based on a desired resonant frequency band of RF energy transmitted by at least one RF source associated with the platform; and
a plurality of thermal vias, each thermal via corresponding to one of the pads and extending through the layer, each thermal via formed of a thermally-conductive material;
wherein each thermal via has a first dimension across the thermal via that is at least one-third as large as a second dimension across the corresponding pad, the first dimension and the second dimension being measured in a same plane.

20. The apparatus of claim 19, wherein the platform comprises a land or air vehicle.

* * * * *